United States Patent [19]

Bonham et al.

[11] Patent Number: 5,723,513
[45] Date of Patent: Mar. 3, 1998

[54] POLYMERS CONTAINING HALOMETHYL-1,3,5-TRIAZINE MOIETIES

[75] Inventors: James A. Bonham, Grant Township, Washington County; Mitchell A. Rossman, Minneapolis; Richard J. Grant, Maplewood, all of Minn.

[73] Assignee: Minnesota Mining and Manufacturing Company, St. Paul, Minn.

[21] Appl. No.: 612,739

[22] Filed: Mar. 8, 1996

Related U.S. Application Data

[63] Continuation of Ser. No. 370,471, Jan. 9, 1995, abandoned, which is a continuation of Ser. No. 49,731, Apr. 19, 1993, abandoned, which is a continuation of Ser. No. 476,340, Feb. 7, 1990, abandoned.

[51] Int. Cl.$^6$ .............. C08L 79/04; C08F 2/50; G03C 1/675; G03F 7/028
[52] U.S. Cl. .............. 522/63; 522/67; 522/904; 522/151; 522/152; 522/166; 522/167; 522/74; 522/79; 522/80; 522/84; 522/78; 522/148; 522/160; 522/88; 522/87; 522/162; 522/150; 522/90; 522/96; 522/121; 522/114; 522/135; 522/142; 430/281.1; 430/286.1; 430/287.1
[58] Field of Search .............. 522/63, 16, 67, 522/904, 151, 152, 166, 167, 174, 74, 79, 80, 84, 78, 148, 88, 87, 160, 162, 150, 90, 96, 121, 114, 135, 142; 526/261; 430/281.1, 286.1, 287.1

[56] References Cited

U.S. PATENT DOCUMENTS

| | | | |
|---|---|---|---|
| 3,154,523 | 10/1964 | D'Alelio | 260/78 |
| 3,453,275 | 7/1969 | Grindahl et al. | 260/248 |
| 3,644,300 | 2/1972 | Dorman et al. | 260/78.4 |
| 3,652,464 | 3/1972 | Grindahl et al. | 260/2 |
| 3,847,916 | 11/1974 | Kim et al. | 260/248 |
| 3,954,475 | 5/1976 | Bonham et al. | 96/67 |
| 4,239,850 | 12/1980 | Kita et al. | 430/281 |
| 4,505,793 | 3/1985 | Tamoto et al. | 204/159.16 |
| 4,820,607 | 4/1989 | Aoai | 430/190 |
| 4,826,753 | 5/1989 | Higashi et al. | 430/281 |
| 4,985,562 | 1/1991 | Rossman et al. | 544/209 |
| 4,997,745 | 3/1991 | Kawamura et al. | 430/281 |
| 5,561,029 | 10/1996 | Fitzgerald et al. | |

FOREIGN PATENT DOCUMENTS

| | | |
|---|---|---|
| A-0 305 115 | 3/1989 | European Pat. Off. |
| A-0 341 720 | 11/1989 | European Pat. Off. |
| A-0 359 430 | 3/1990 | European Pat. Off. |
| A-0 359 431 | 3/1990 | European Pat. Off. |
| A-0360434 | 3/1990 | European Pat. Off. |
| A-0441524 | 8/1991 | European Pat. Off. |
| A-3926666 | 2/1990 | Germany. |

OTHER PUBLICATIONS

Chemical Abstracts, vol. 107, No. 24, 14 Dec. 1987, 226012v.
Chemical Abstracts, vol. 66, No. 19, 08 May 1967, 85771n.
Chemical Abstracts, vol. 82, No. 8, 24 Feb. 1975, 44610w.
Chemical Abstracts, vol. 67, No. 14, 2 Oct. 1967, 64842s.
Chemical Abstracts, vol. 70, No. 23, 9 Jun. 1969, 105898x.

*Primary Examiner*—Susan W. Berman
*Attorney, Agent, or Firm*—Arlene K. Musser; Walter N. Kirn

[57] ABSTRACT

Radiation-sensitive organo-halogen compounds that have a photo-labile halomethyl-1,3,5-triazine moiety and a polymeric moiety within the same molecule. The compounds of this invention are comprised of a polymeric moiety having attached or incorporated within its structure at least one 1,3,5-triazine nucleus, said triazine nucleus having at least one halomethyl substituent attached to a carbon atom of the triazine nucleus. These compounds are capable of being stimulated by actinic radiation at wavelengths of from about 250 to about 900 nanometers to generate free radicals and/or acids. The compounds of this invention are useful as photoinitiators in free radical polymerization reactions, oxidation-reduction reactions, or reactions sensitive to acid, and they also exhibit the capability to crosslink upon exposure to light.

21 Claims, No Drawings

POLYMERS CONTAINING HALOMETHYL-1, 3,5-TRIAZINE MOIETIES

This is a continuation of U.S. application Ser. No. 08/370,471 filed Jan. 9, 1995, now abandoned, which is a file-wrapper continuation of U.S. application Ser. No. 08/049,731 filed Apr. 19, 1993, now abandoned, which is a continuation of U.S. application Ser. No. 07/476,340 filed Feb. 7, 1990, now abandoned.

BACKGROUND OF INVENTION

1. Field of the Invention

The present invention relates to photosensitive compounds, more particularly polymers containing halomethyl-1,3,5-triazine moieties and to radiation-sensitive compositions and elements utilizing these polymers.

2. Discussion of the Prior Art

Compounds that decompose to generate free radicals (free radical generating agents) upon exposure to light are well known in the graphic arts. Organic halogen compounds, which are capable of generating free radicals such as a chlorine free radical or a bromine free radical upon exposure to light, have been widely used as photoinitiators in photopolymerizable compositions, as photoactivators in free radical photographic compositions, and as photoinitiators for reactions catalyzed by acids formed by light. The spectral sensitivity of these compositions may be broadened by the addition of sensitizers, which, in essence, transfer their absorbed energy to the halocarbon compound. The use of such halogen compounds in photopolymerization processes and free radical photographic processes have been described in J. Kosar, *Light-Sensitive Systems*, J. Wiley & Sons (New York: 1965), pp. 180–181, 361–370.

Halomethyl-1,3,5-triazines are known to be initiators for a number of photochemical reactions. They are employed to produce free radicals for initiating polymerization or color changes and for initiating secondary reactions upon liberation of acid by the interaction of free-radicals when hydrogen donors are present.

Examples of the use of halomethyl-1,3,5-triazines in the free radical polymerization of acrylate monomers are described in U.S. Pat. No. 3,905,815; U.S. Pat. No. 3,617,288; U.S. Pat. No. 4,181,752; U.S. Pat. No. 4,391,687; U.S. Pat. No. 4,476,215; and DE 3,517,440. U.S. Pat. No. 3,779,778 discloses the photoinitiated acid catalyzed decomposition of pyranyl ether derivatives to produce photosolubilizable compositions useful as positive printing plates. Chromophore substituted styryl-1,3,5-triazines and their uses are disclosed in U.S. Pat. No. 3,987,037 and U.S. Pat. No. 3,954,475.

Radiation sensitive compositions containing bi- and polyaromatic substituted triazines are disclosed in U.S. Pat. No. 4,189,323.

SUMMARY OF THE INVENTION

This invention provides radiation-sensitive organohalogen compounds that have a photo-labile halomethyl-1,3,5-triazine moiety and a polymeric moiety within the same molecule. The compounds of this invention are comprised of a polymeric moiety having attached or incorporated within its structure at least one 1,3,5-triazine nucleus, said triazine nucleus having at least one halomethyl substituent attached to a carbon atom of the triazine nucleus. These compounds are capable of being stimulated by actinic radiation at wavelengths of from about 250 to about 900 nanometers to generate free radicals and/or acids.

The compounds of this invention are useful as photoinitiators in free radically polymerizable compositions, in photoredox reactions, and in reactions sensitive to halogen acids. The compounds also exhibit the capability to crosslink upon exposure to light. The compounds are useful in a variety of photosensitive compositions and elements used in printing, duplicating, copying, photography, and other imaging systems as well as in photocurable coatings such as ultraviolet curable printing inks, protective coatings, release liners, photoresists, and the like.

DETAILED DESCRIPTION OF THE INVENTION

As used herein, the terms "polymeric moiety" and "polymer" refer to macromolecules having molecular weights ranging from about several thousand to about several million that have been derived by the linking together of large numbers, e.g., tens, hundreds, thousands, or more, of smaller molecules. The smaller molecules that combine with each other are commonly referred to as "monomers" or "prepolymers", and the reactions by which they combine are commonly referred to as "polymerizations". Polymers are illustrated schematically by using the appropriate structural repeating unit or units, which, in many instances, are schematic illustrations of the monomer or prepolymer starting materials. A comprehensive reference on polymer chemistry, reactions, monomers, properties, and nomenclature can be found in Odian, *Principles of Polymerization*, 2nd Edition, J. Wiley & Sons (New York: 1981), and in the *Encyclopedia of Polymer Science and Engineering*, J. Wiley & Sons (New York: 1988).

As used herein, the term "polymer" includes both homopolymers, i.e., polymers wherein all monomeric units are identical, and copolymers, i.e., polymers wherein more than one type of monomeric unit is present.

As used herein, the term "halomethyl-1,3,5-triazine moiety" means a 1,3,5-triazine having substituted on at least one of the carbon atoms of the triazine ring at least one member selected from the group consisting of mono-, di-, and trihalomethyl groups.

Preferred halomethyl-1,3,5-triazine moieties of this invention can be represented by the general formula (I):

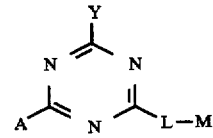

wherein

A represents a member selected from the group consisting of mono-, di- and trihalomethyl groups, Y represents a member selected from the group consisting of —A, —L—, —NH$_2$, —NHR, —NR$_2$, —OR, and —R' where each R independently represents a substituted or unsubstituted alkyl group, a substituted or unsubstituted aryl group, and R' represents a substituted or unsubstituted alkyl group, a substituted or unsubstituted aryl group, a substituted alkenyl group or substituted polyalkenyl group, a substituted alkynyl group or substituted polyalkynyl group, and a substituted or unsubstituted heteroaromatic group, and L represents a group or covalent bond linking the triazine nucleus to the polymeric moiety.

Whenever there is only one L group, the halomethyl-1, 3,5-triazine moiety would be considered attached to the polymeric moiety as a pendent or terminal group. If there are two L groups, i.e., if Y=—L—, then the halomethyl-1,3,5-triazine would be considered as being part of the polymeric backbone.

Halomethyl groups that are suitable for the present invention include chloro-, bromo-, and iodomethyl groups, with chloro- and bromomethyl groups being preferred. Trihalomethyl groups are preferred; trichloromethyl and tribromomethyl groups are most preferred.

When R or R' represents an alkyl group, it is preferred that it have one to twelve carbon atoms, preferably one to six carbon atoms.

When R or R' represents a substituted or unsubstituted aryl group, it is preferred that the group have no more than five fused rings, more preferably no more than three fused rings, such as, for example, phenyl, naphthyl, anthracenyl. When R represents a substituted aryl group, suitable substituents include, but are not limited to, halogen atoms; alkyl groups, preferably having one to twelve carbon atoms; aryl groups; alkoxy groups; aryloxy groups; alkylthio groups; amino groups, carboxylic acid groups and their esters; acyl groups; acyl amino groups; nitro groups; and sulfonic acid groups.

When R' represents a substituted aryl group, substituents can include not only the substituents that are suitable for R when R represents an aryl group, but also a substituted alkenyl or polyalkenyl group, preferably having one to six conjugated carbon-to-carbon double bonds, more preferably one to two conjugated carbon-to-carbon double bonds, and substituted with an aryl or heteroaromatic group (such as phenyl, 4-methoxy-1-naphthyl, 2-benzothiazole); a substituted alkynyl group, preferably having one to three conjugated carbon-to-carbon triple bonds, more preferably one ethynyl group, and substituted with an aryl or heteroaromatic group (such as phenyl, 2-thienyl).

When R' represents a heteroaromatic group, it is preferred that the group contain a maximum of three fused rings. It is preferred that the heteroatoms be selected from the group consisting of nitrogen, oxygen, sulfur, and combinations thereof. Examples of heteroaromatic groups useful as R' include, but are not limited to, those derived from a furan group, a thiophene group, a pyrrole group, a pyridine group, an oxazole group, an isooxazole group, a thiazole group, an imidazole group, a benzofuran group, a benzothiophene group, a benzimidazole group, a benzotriazole group, a quinoline group, a benzoxazole group, and a benzothiazole group. Other examples of heteroaromatic groups substituted on halomethyl-1,3,5-triazines are recited in U.S. Pat. No. 3,987,037 and U.S. Pat. No. 4,772,534.

When R' represents a substituted alkenyl or polyalkenyl group, it is preferred that the group have one to six conjugated carbon-to-carbon double bonds, more preferably one to three conjugated carbon-to-carbon double bonds, and substituted with an aryl or heteroaromatic group (such as styryl, 2-benzoxazole).

When R' represents a substituted alkynyl group, it is preferred that the group have one to three conjugated carbon-to-carbon triple bonds, more preferably one ethynyl group, and substituted with an aryl or heteroaromatic group (such as phenyl, 2-pyridyl).

When R' is substituted with a heteroaromatic group, these heteroaromatic groups can be the same as those previously described herein.

When R or R' represents an alkyl group, aryl group, or heteroaromatic group, the particular identity of R and R' and their substituents, if any, is not critical. Certain groups may be selected to impart or modify a physical property of the polymers of this invention, such as solubility, softness, or hardness. Alternatively, R' and its substituents can be selected to impart a certain spectral response to the triazine moiety within the polymers of this invention, based on their intended use. However, the substituents should not adversely affect the desired light sensitivity of the polymers of the invention.

L represents a group that links the triazine nucleus to the polymeric moiety. The precise identity of L is not critical, but it should be selected so that it does not interfere with or adversely affect the light sensitivity of the compound. L can be formed from a single group or it can be formed from a combination of groups. In addition, L can also be a covalent bond. Groups that are suitable for linking groups include carbamato (—NHCO$_2$—), urea (—NHCONH—), amino (—NH—), amido (—CONH—), aliphatic, e.g., having up to 10 carbon atoms, alkyl, e.g., having up to 10 carbon atoms, haloalkyl, e.g., having up to 10 carbon atoms, alkenyl, e.g., having up to 10 carbon atoms, aryl, e.g., having one ring, styryl, ester (—CO$_2$—), ether (—O—), and combinations thereof. Based on ease of synthesis, the most preferred groups for attachment directly to the triazine nucleus are carbamato, urea, amino, alkenyl, aryl, ester, and ether.

The following groups exemplify typical —L— group combinations (R represents a triazine nucleus):

—OCONHR
—CH$_2$OCONHR
—CO—p—C$_6$H$_4$—NHCONHR
—CO$_2$CH$_2$CH$_2$OCONHR
—CO$_2$CH$_2$CH$_2$O—p—C$_6$H$_4$—R
—CO$_2$CH$_2$CH$_2$O—p—C$_6$H$_4$—CH=CHR
—CO$_2$CH$_2$CH$_2$NHCO$_2$CH$_2$CH$_2$O—m—C$_6$H$_4$—CH=CHR

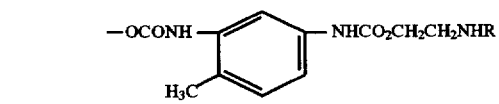

—CONHC(CH$_3$)$_2$CO$_2$CH$_2$CH$_2$O—p—C$_6$H$_4$—CH=CH—C$_6$H$_4$—R

In many cases, L can be selected to contain a reactive group or polymerizable group that will be useful in polymerization reactions to prepare polymers containing halomethyl-1,3,5-triazine moieties. Typical reactive groups contained in L and useful in polymerization reactions include, but are not limited to, hydroxyls; isocyanates; amines; carboxylic acids; vinyl monomers such as acrylates, methacrylates, vinyl esters, acrylamides, methacrylamides, and styrenes; vinyl ethers; and cyclic ethers. In other cases, L can be selected to contain a reactive group that can combine with a functional group attached to a preformed polymer. Examples of such reactive groups include, but are not limited to, isocyanates, hydroxyls, amines, carboxylic acids, anhydrides, and epoxides.

It is reasonable to conclude that nearly all of the common polymers can be modified to contain a halomethyl-1,3,5-triazine moiety attached to or incorporated within the backbone thereof. Examples of some of the common polymers include, but are not limited to, polyamides, polyesters, polyurethanes, polysiloxanes, phenolic resins, poly(aryl methylenes), polystyrenes, poly(acrylic esters), poly(acrylic acids), polyacrylamides, polyacrylonitrile, polyethylenes, polybutadienes, polyvinyl esters, polyvinyl alcohol, polyvinyl acetals, polyvinyl ethers, polyvinyl pyrrolidone, polyvinyl pyridine, polyvinyl chloride, polyethylene oxides, polypropylene oxides, polyethylene glycols, polypropylene glycols, polyethyleneimines, epoxide resins, phenoxy resins, polytetrahydrofuran, polycaprolactone, poly(styrene sulfonic acid), gelatins, alkylcelluloses, hydroxyalkylcelluloses, carboxymethylcelluloses, starches, and polysaccharides. Molecular weights ranging from several thousand to several million can be attained.

One method by Which polymers containing halomethyl-1,3,5-triazine moieties of this invention can be prepared is by the reaction of a triazine with a polymer having a functional group which will combine with a reactive group of the triazine. An example of such a reaction is the addition reaction of isocyanato-substituted halomethyl-1,3,5-triazines with polymers having groups reactive with the isocyanate group. The isocyanato-substituted triazines can be prepared from the corresponding amino derivative according to the procedure of U. von Gizycki, Angew. Chem. Int. Ed. Eng., 1971, 10, 403. Isocyanato-1,3,5-triazines suitable for this reaction include:

2,4-bis(trichloromethyl)-6-isocyanato-1,3,5-triazine
2-isocyanato-4-methyl-6-trichloromethyl-1,3,5-triazine
2-isocyanato-4-phenyl-6-trichloromethyl-1,3,5-triazine
2-isocyanato-4-methoxy-6-trichloromethyl-1,3,5-triazine
2-isocyanato-4-(p-methoxyphenyl)-6-trichloromethyl-1,3,5-triazine
2-isocyanato-4-(p-methoxystyryl)-6-trichloromethyl-1,3,5-triazine
2-isocyanato-4-(m,o-dimethoxyphenyl)-6-trichloromethyl-1,3,5-triazine Typical polymers that will combine with the isocyanato group include polyvinyl alcohol, poly(2-hydroxyethyl) methacrylate, polyvinyl formal, polyvinyl butyral, polycaprolactone, polyethylene oxide polyol, polytetrahydrofuran, polyethylene adipate, hydroxy-terminated polybutadiene, polypropylene glycol, and various hydroxy- and amino-terminated polysiloxanes.

The isocyanate addition reaction can be carried out in the presence of solvents such as, for example, toluene, pyridine, benzene, xylene, dioxane, tetrahydrofuran, etc., and mixtures of solvents.

The duration and temperature of the reaction is dependent on the particular compounds and the catalyst for the reaction. Generally, temperatures of about 25° to 150° C. for from one to seventy-two hours are sufficient for the reaction. Preferably, the reaction is carried out at room temperature for from three to seventy-two hours. The preferred catalyst is di-n-butyltin dilaurate, but other catalysts are satisfactory.

Another method for preparing polymers having halomethyl-1,3,5-triazine moieties from existing polymers is to react hydroxyl-substituted halomethyl-1,3,5-triazines with polymers having groups that are reactive with the hydroxyl group. Examples of such groups include, but are not limited to, isocyanates, epoxides, anhydrides, oxazolinones, and acid chlorides. Typical polymers that contain some of these groups include 2-isocyanatoethyl methacrylate copolymers, isocyanate terminated oligomers of polyols and polyesters, styrene-maleic anhydride copolymers, vinyl ether-maleic anhydride copolymers, and vinyl oxazolinone copolymers.

Halomethyl-1,3,5-triazines suitable for this reaction include:

2-amino-4,6-bis(trichloromethyl)-1,3,5-triazine
2-(2-hydroxyethylamino)-4,6-bis(trichloromethyl)-1,3,5-triazine
2-(2-hydroxyethylamino)-4-methyl-6-trichloromethyl-1,3,5-triazine
2-(2-hydroxyethylamino)-4-phenyl-6-trichloromethyl-1-3,5-triazine
2-(2-hydroxyethylamino)-4-methoxy-6-trichloromethyl-1,3,5-triazine
2-(2-hydroxyethylamino)-4-methoxy-6-trichloromethyl-1,3,5-triazine
2,4-bis(trichloromethyl)-6-(p-hydroxyphenyl)-1,3,5-triazine
2,4-bis(trichloromethyl)-6-(p-hydroxystyryl)-3,5-triazine
2,4-bis(trichloromethyl)-6-[p-(2-hydroxyethoxy)phenyl]-1,3,5-triazine
2,4-bis(trichloromethyl)-6-[p-(2-hydroxyethoxy)styryl]-1,3,5-triazine A class of polymers particularly preferred for this invention are acrylic and acrylamide polymers, for the reasons that they are structurally versatile, easy to synthesize, have good physical properties, and provide good performance. While they can be prepared as discussed previously, another convenient method that can be used to prepare these materials is the free radical polymerization of halomethyl-1,3,5-triazines having an attached acrylate, methacrylate, acrylamide, methacrylamide, or styrene monomer moiety. Representative examples of these monomer substituted triazine compounds are listed in Table I.

TABLE I

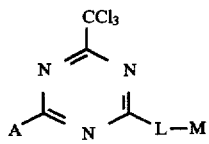

| | −A | −L−M |
|---|---|---|
| 1 | −CCl₃ | −NHCOCH₂CH₂OCCH=CH₂ (with two C=O) |
| 2 | −CCl₃ | −NHCOCH₂CH₂OCC(CH₃)=CH₂ (with two C=O) |

TABLE I-continued

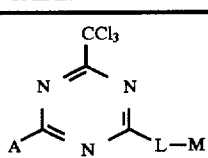

| | −A | −L−M |
|---|---|---|
| 3 | 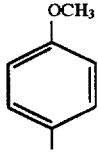 OCH₃ | 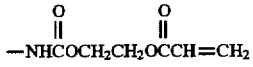 —NHCOCH₂CH₂OCCH=CH₂ (with two C=O) |
| 4 | 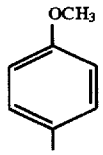 OCH₃ | —NHCOCH₂CH₂OCC(CH₃)=CH₂ (with two C=O) |
| 5 |  OCH₃, OCH₃ | —NHCOCH₂CH₂OCCH=CH₂ (with two C=O) |
| 6 | 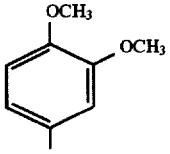 OCH₃, OCH₃ | —NHCOCH₂CH₂OCC(CH₃)=CH₂ (with two C=O) |
| 7 | —CCl₃ | 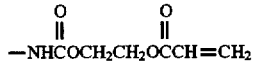 —CH=CH—C₆H₄—OCH₂CH₂OCC(CH₃)=CH₂ |
| 8 | —CCl₃ | 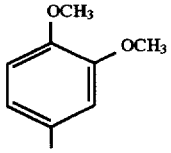 —CH=CH—C₆H₄—OCH₂CH₂OCC(CH₃)₂—NH—C(=O)—C(CH₃)=CH₂ |
| 9 | —CCl₃ | 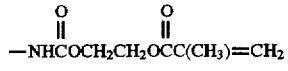 —CH=CH—C₆H₄—OCH₂CH₂OCCH=CH₂ |
| 10 | —CCl₃ |  —CH=CH—C₆H₄—OCH₂CH₂OCNHCH₂CH₂OCC(CH₃)=CH₂ |
| 11 | —CCl₃ | 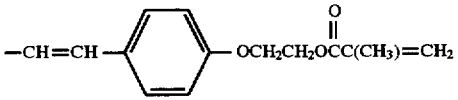 —C₆H₄—CH=CH—C₆H₄—OCH₂CH₂OCNHCH₂CH₂OCC(CH₃)=CH₂ |

From the foregoing table, it should not be inferred that the halomethyl groups suitable for the compounds of this invention are to be limited to —CCl₃.

Comonomers useful in the copolymerization reaction with monomer substituted halomethyl-1,3,5-triazines include, but are not limited to, acrylic and methacrylic acid;

acrylic and methacrylic esters, such as methyl, ethyl, butyl, octyl, 2-dimethylaminoethyl, 2-methoxyethyl, 2-hydroxyethyl, 2-chloroethyl, benzyl, glycidyl, 2-cyanoethyl, tetrahydrofurfural; acrylamide and its derivatives, such as N-methylolacrylamide, N-isobutoxymethylacrylamide, and methacrylamide; styrene, maleic anhydride, 4-vinyl pyridine, 2-methacryloyloxyethane-1-sulfonic acid and its salts, acrylonitrile, vinyl ethers such as ethyl vinyl ether. Comprehensive lists of acrylic and acrylamide monomers can be found in *Encyclopedia of Polymer Science*, 2nd Edition, Vol. 1, pp. 182, 204, 237, 242, and 243.

Another class of useful polymers, based on ease of synthesis and versatility, are the polyurethanes, which are normally formed from a diol, diisocyanate, and a chain extender. Halomethyl-1,3,5-triazine derivatives having either dihydroxyl or diisocyanate groups are particularly useful reactants. The dihydroxyl derivatives may be used directly or converted to a diisocyanate prepolymer by reaction with a diisocyanate such as tolylene-2,4-diisocyanate. Other diols such as hydroxyl terminated linear aliphatic polyesters and aliphatic polyethers as well as other aromatic, aliphatic, cycloaliphatic or polycyclic diisocyanates can be used in conjunction with them. This flexibility in the selection of reactants allows for a wide range of molecular weights and physical properties. The technology of polyurethane elastomers, the chemistry, basic structure, and synthetic routes is reviewed in C. Hepburn, *Polyurethane Elastomers*, Applied Science Publishers (New York: 1982); and in *Encyclopedia of Polymer Science and Engineering*, 2nd Edition, Vol. 13, pp. 243–303.

Suitable dihydroxyl or diisocyanato substituted halomethyl-1,3,5-triazines that can be employed in the preparation of polyurethanes include:

2-[bis(2-hydroxyethyl)amino]-4,6-bis(trichloromethyl)-1,3,5-triazine 2,4-bis(2-hydroxyethylamino)-6-trichloromethyl-1,3,5-triazine 2-[bis(2-hydroxyethyl)amino]-4-(p-methoxystyryl)-6-trichloromethyl-1,3,5-triazine 2-[p-(2-hydroxyethoxy)styryl]-4-(2-hydroxyethylamino)-6-trichloromethyl-1,3,5-triazine 2-(4-styrylphenyl)-4-[bis(2-hydroxyethyl)amino]-6-trichloromethyl-1,3,5-triazine 2-[p-bis(2-hydroxyethylamino)styryl]-4,6-bis(trichloromethyl)-1,3,5-triazine 2,4-bis(isocyanato)-6-trichloromethyl-1,3,5-triazine The halomethyl-1,3,5-triazine content of the polymers of the present invention can theoretically range from about 0.01% to 90% on a molar basis. On a practical basis, however, the lower limit is approximately 0.10% and the upper limit is approximately 70% on a molar basis. Thus, considerable latitude is possible in achieving an halomethyl-1,3,5-triazine content of a polymer to fit the requirements of a particular application. For example, whenever it is desirable to keep the amount of polymer concentration low in a photosensitive composition yet still provide an effective amount of the photoinitiator, then a higher content, e.g., 25 to 70 mole percent, of halomethyl-1,3,5-triazine within the polymer may be preferred. In instances where the photosensitive composition is largely comprised of the polymers of this invention, then it may be more desirable to have the halomethyl-1,3,5-triazine content in the lower ranges, e.g., from 0.5 to 20 mole percent.

The polymers of this invention can also exhibit a wide range of molecular weights, solubilities, hardness, tear strength, modulus, elongation, adhesion, clarity, etc. The importance of these various characteristics will largely depend on the particular application for which the material will be used. Because the polymers having halomethyl-1,3,5-triazine moieties will function as light sensitive materials even at low concentrations of the halomethyl-1,3,5-triazine moiety, the predominate physical properties of the backbone polymer will be largely retained. Therefore, the design of the polymer having the halomethyl-1,3,5-triazine moiety can utilize existing polymer technology to achieve gross properties.

The molecular weight of the polymers of this invention can vary from about 1,000 to about 1,000,000 or greater. The molecular weight preferably ranges from about 5,000 to about 1,000,000.

Polymers having halomethyl-1,3,5-triazine moieties that are soluble or dispersible in a wide range of common solvents can be prepared. Such common solvents include hydrocarbons, chlorinated hydrocarbons, aromatics, ketones, esters, alcohols, water, and combinations thereof. The solubility or dispersibility is a function of the chemical nature of either the substituents or segments within the polymer. Various solubilizing or dispersing groups can be employed, especially in applications where a solubility or dispersibility in water is desired. Ionic substituents such as alkyl and aryl carboxylic acids, sulfonic acids, phosphonic acid, phenols, and their salts, as well as aryl and alkyl amines, such as pyridine and piperidine, and quaternary salts of alkyl and aryl amines, are particularly useful in promoting solubility or dispersibility in water. Polymers or copolymers of this invention that contain segments that are useful for promoting solubility or dispersibility in water can be derived from water-soluble monomers, such as, for example, ethylene oxide, vinyl pyrrolidone, vinyl alcohol, acrylamide, vinyl ethers, and ethylene imine.

The polymers of this invention are particularly useful for preparing photosensitive compositions. In reactions where a halomethyl-1,3,5-triazine moiety functions as a photoinitiator, such as free radical photopolymerization reactions, oxidation-reduction reactions, or reactions sensitive to acid, the polymers can be used to provide the halomethyl-1,3,5-triazine photoinitiator. A major advantage of these polymers as photoinitiators is the reduction of undesirable initiator migration, especially within multilayer compositions. Migration typically occurs in photopolymerizable compositions containing low molecular weight monomers and plasticizers, which tend to diffuse between layers, carrying along other ingredients such as the photoinitiator. The polymers of this invention are less susceptible to migration on account of the anchoring or ballasting of the halomethyl-1,3,5-triazine. The polymers of this invention can be used to prepare compositions that will photocrosslink upon exposure to actinic radiation. Compositions comprising these halomethyl-1,3,5-triazine polymers can be applied very simply from a solution.

The polymers of this invention can be used advantageously as photoinitiators in free radically photopolymerizable compositions. Compositions of this type typically comprise an unsaturated, free radical initiated, chain propagating addition polymerizable compound, a polymer of this invention and, optionally, one or more fillers, binders, dyes, polymerization inhibitors, color precursors, oxygen scavengers, etc. The compound of this invention should be present in an amount sufficient to effect polymerization of the polymerizable compound.

Another advantage of the polymer of this invention is that the addition of a separate polymeric binder is not necessary, thereby simplifying the formulation and minimizing compatibility problems.

The exact amount of polymer needed to function as a photoinitiator will depend on the halomethyl-1,3,5-triazine moiety content in that particular polymer. Typically, however, the halomethyl-1,3,5-triazine moiety represents about 0.5 to about 15%, preferably about 1 to about 7.5%, of the total polymerizable composition.

The polymers of this invention can also be used advantageously as the primary component in simple photocrosslinkable compositions. Other advantages with respect to free radical photopolymerizable compositions containing low molecular weight monomers include the elimination of the monomer itself. The presence of monomers is environmentally undesirable and leads to other problems such as tacky coatings, migration, oxygen inhibition, and major physical property changes upon exposure due to high crosslinking densities.

It is relatively easy to prepare photocrosslinkable compositions comprised primarily of the polymers of this invention. Compositions of this type typically comprise a polymer of this invention, and optionally, one or more fillers, dyes, pigments, plasticizers, and other additives. Upon exposure to actinic radiation, these polymers will undergo crosslinking, which renders them insoluble. The crosslinking reaction is very efficient and can occur with as low as 0.5% by weight of the halomethyl-1,3,5-triazine moiety present in a given polymer. The preferred weight range of the halomethyl-1,3,5-triazine moiety is from about 1 to about 20%. The crosslinking reaction is believed to result from the photodecomposition of the halomethyl-1,3,5-triazine moiety to create free radicals. These free radicals can either combine between polymers or abstract hydrogens to create other sites on the polymer which will then combine. Crosslinking efficiency appears to be enhanced by the presence of abstractable hydrogen atoms within the polymer.

Although the halomethyl-1,3,5-triazine moiety is sufficient to cause the photocrosslinking reaction of the polymers of this invention, other compounds capable of participating in crosslinking, either directly or by free radical or acid induced reactions, can be added to the composition, if desired. It is preferred, however, that substituents be covalently attached to the polymers of the invention to assist crosslinking instead of adding such other materials. Examples of such substituents include acrylate and methacrylate groups, acrylamide groups, and vinyl ethers, among others. The number of these groups can vary but typically range from 1 to 20% by weight of the polymer.

Unsaturated, free-radical initiated, chainpropagating addition polymerizable compounds suitable for use with the compound of this invention include alkylene or polyalkylene glycol diacrylates, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, pentaerythritol tetramethacrylate, pentaerythritol triacrylate, sorbitol hexaacrylate; bis[1-(3-acryloxy-2-hydroxy)]-p-propoxyphenyl dimethylmethane, bis[1-(2-acryloxy)]-p-ethoxyphenyl-dimethylmethane, tris hydroxyethyl-isocyanurate trimethacrylate, the bis-acrylate and the bis-methacrylates of polyethylene glycols of molecular weight 200–500 and the like; unsaturated amides, e.g., methylene bis-acrylamide, methylene bis-methacrylamide, 1,6-hexamethylene bis-acrylamide, diethylene triamine trisacrylamide, beta-methacrylaminoethyl methacrylate; vinyl esters such as divinyl succinate, divinyl adipate, divinyl phthalate. The preferred unsaturated compounds include pentaerythritol tetraacrylate, bis[p-(3-acryloxy-2-hydroxypropoxy)phenyl]-dimethylmethane, and bis[p-(2-acryloxyethoxy)phenyl]-dimethylmethane. Mixtures of these esters can also be used as can mixtures of these esters with alkyl esters of acrylic acid and methacrylic acid, including such esters as methyl acrylate, methyl methacrylate, ethyl acrylate, isopropyl methacrylate, n-hexyl acrylate, stearyl acrylate, allylacrylate, styrene, diallyl phthalate, and the like.

In another embodiment, polymerizable moieties of the foregoing types can form a part of a substituent on the polymeric backbone along with the halomethyl-1,3,5-triazine moiety to enhance crosslinking.

The sensitivity of compositions containing the compounds of this invention to actinic radiation of a particular wavelength range can be increased by the incorporation of known ultraviolet and visible light sensitizers including cyanine, carbocyanine, merocyanine, styryl, acridine, polycyclic aromatic hydrocarbons, polyarylamines, and amino-substituted chalcones. Cyanine dyes suitable for this invention are described in U.S. Pat. No. 3,495,987. Styryl dyes and polyarylamines suitable for this invention are described in J. Kosar, *Light Sensitive Systems*, J. Wiley & Sons (New York: 1965), pp. 361–369. Polycyclic aromatic hydrocarbons useful as sensitizers are disclosed in U.S. Pat. No. 3,640,718, an example of which is 2-ethyl-9,10-dimethoxyanthracene. Amino substituted chalcones useful as sensitizers are described in U.S. Pat. No. 3,617,288.

The compounds of this invention can be used in photosensitive compositions in combination with other photoinitiators including benzophenones, benzoin ethers, thioxanthone, benzil, and Michler's ketone. The compounds of this invention can also be substituted for the triazines used in conjunction with dialkylamimo aromatic carbonyl compounds, as disclosed in U.S. Pat. No. 4,259,432, with 2-(benzoylmethylene)-5-benzothiazolidene thiazole-4-1 compounds, as disclosed in E application 0109291, May 23, 1984; with three keto-substituted coumarin compounds, as disclosed in U.S. Pat. No. 4,505,793, as well as those described in U.S. Pat. No. 4,239,850, Jpn. Kokai Tokyo Koho JP 60 60,104 (85 60104); and Ger. Offen. 2,851,641.

To prepare the photosensitive compositions of this invention, the components can be admixed in any order and stirred or milled to form a solution or uniform dispersion. Photosensitive elements can be made by coating a photosensitive composition on a suitable base or support and drying the coating. The dry thickness typically ranges from about 0.00005 to about 0.075 in.

Suitable bases or supports for the photosensitive compositions include metals, e.g., steel and aluminum plates, sheets and foils, and films or plates composed of various film-forming synthetic or high polymers including addition polymers, e.g., vinylidene chloride, vinyl chloride, vinyl acetate, styrene, isobutylene polymers and copolymers; linear condensation polymers, e.g., polyethylene terephthalate, polyhexamethylene adipate, polyhexamethylene adipamide/adipate.

The invention will be more specifically illustrated by the following non-limiting examples. All parts and percentages are by weight, unless otherwise indicated.

EXAMPLES 1–5

Examples 1–5 illustrate the preparation of polymers substituted with pendent halomethyl-1,3,5-triazines by means of an isocyanate addition reaction with a hydroxyl group on the polymer.

Example 1

A styrene-allyl alcohol copolymer (2.0 g, "RJ 101", Monsanto) having a hydroxy equivalent weight of 220 and weight average molecular weight of 1700 was finely ground with a mortar and pestle, dried in a vacuum oven over phosphorus pentoxide, and dissolved in a solution of 12 drops of di-n-butyltin dilaurate in 200 ml dry pyridine (which had been freshly distilled from calcium hydride). To this solution was added a solution containing 1.0 g (0.003 mole) 2,4-bis(trichloromethyl)-6-isocyanato-1,3,5-triazine in toluene. The reaction mixture was stirred at room temperature under nitrogen atmosphere for 24 hours. The solvent was removed at room temperature on a rotary evaporator under reduced pressure. The residue was triturated with dichloromethane and dried on a high vacuum to afford 3.1 g of a semi-crystalline product. The infrared spectrum was consistent with a product having the general formula:

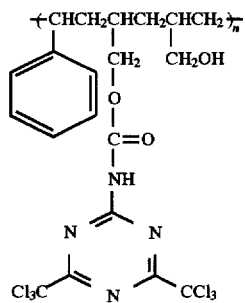

Example 2

The procedure of Example 1 was repeated with the exception that the copolymer reacted was a hydrolyzed (75%) polyvinyl alcohol having an average molecular weight of 2,000. A white powder (2.9 g) was isolated. The infrared spectrum was consistent with a product having the general formula:

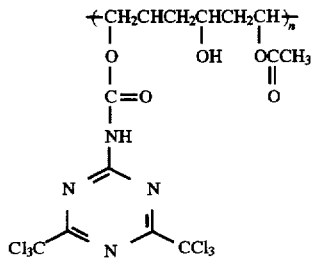

Example 3

The procedure of Example 1 was repeated with the exception that the polymer reacted was poly(2-hydroxyethyl methacrylate) (Aldrich Chemical) to give 3.0 g of product. The infrared spectrum was consistent with a product having the general formula:

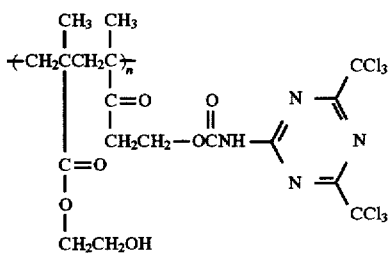

Example 4

The procedure of Example 1 was repeated with the exception that the polymer reacted was a polyvinyl formal resin ("Formvar 12/85", Monsanto) having a molecular weight of 36,000–45,000 to yield 2.8 g of the product. The infrared spectrum was consistent with a product having the general formula:

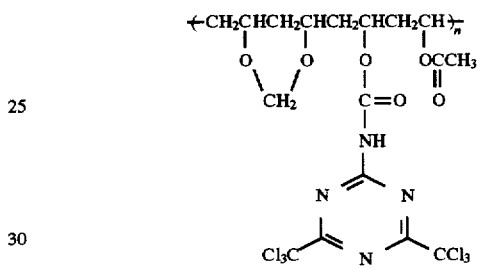

Example 5

The procedure of Example 1 was repeated with the exception that the polymer reacted was a polyvinyl butyral resin ("Butvar B-90", Monsanto) having molecular weights of 36,000–45,000 to yield 2.9 g of product. The infrared spectrum was consistent with a product having the general formula:

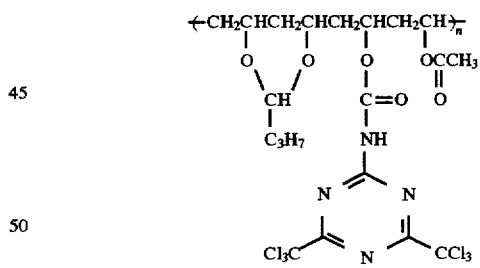

EXAMPLES 6–7

Examples 6 and 7 illustrate the preparation of polymers having pendent halomethyl-1,3,5-triazine moieties from polymers having reactive groups, in particular, azlactone and maleic anhydride groups.

Example 6

This example illustrates the preparation of polymer-substituted halomethyl-1,3,5-triazine by means of an addition reaction.

To a solution of 4.7 g of a copolymer containing 87 percent by weight methyl methacrylate and 13 percent by weight 1-vinyl-4,4-dimethyl oxazolin-5-one in 18 ml ethyl acetate was added 0.52 g of 2,4-bis(trichloromethyl)-6-[p-(2-hydroxyethoxy)styryl]-1,3,5-triazine (hereinafter MOSTOL). To the resulting solution was then added a solution of 0.007 g ethanesulfonic acid in two ml ethyl g ethanesulfonic acid in two ml ethyl acetate. The reaction mixture was stirred at 55° C. for 18 hours, and the solvent was removed on a rotary evaporator to afford product. The infrared spectrum was consistent with reaction of the MOSTOL with the azlactone to form a ring opened adduct having the general formula:

Example 8

To a solution of 2.0 g (0.003 mole) of a polymeric diamine ("Polamine 1000", Polaroid) having an equivalent weight of 629 and two drops of di-n-butyltin dilaurate in 50 ml of dry tetrahydrofuran was added a solution containing 2.12 g (0.006 mole) of 2,4-bis(trichloromethyl)-6-isocyanato-1,3,5-triazine in 20 ml of dry tetrahydrofuran. The reaction mixture was stirred at room temperature for 48 hours and the solvent removed on a rotary evaporator. A viscous oil (2.1 g) was isolated. The infrared spectrum was consistent with a product having the general formula:

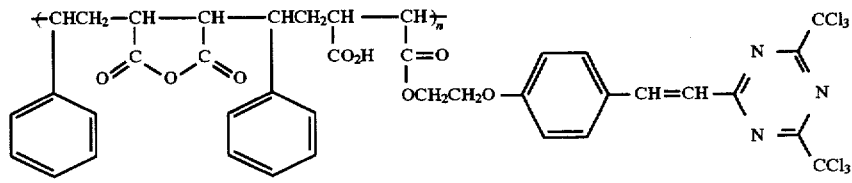

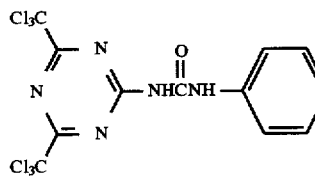

Example 9

The procedure of Example 8 was repeated with the exception that the polymer reacted was a polycaprolactone diol (one equivalent, "Union Carbide T0200") having a hydroxy equivalent weight of 259 with two equivalents of the isocyanato triazine to yield a viscous oil. The infrared spectrum was consistent with a product having the general formula:

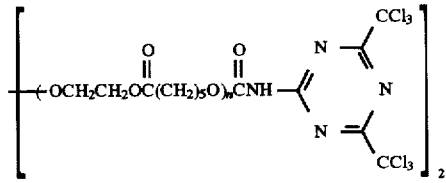

Example 7

A solution containing 5.0 g of a 1:1 styrene-maleic anhydride copolymer ("SMA 1000A", Arco Chemical), 1.34 g of MOSTOL, and 0.025 g of p-toluenesulfonic acid monohydrate in 15 ml of xylene was heated for 1.5 hours in a closed vessel at a temperature of 150° C. The vessel was opened and the xylene allowed to evaporate at 150° C. to give a yellow glassy solid. Thin layer chromatography indicated that all of the MOSTOL had reacted and the infrared analysis was consistent with the incorporation of the MOSTOL onto the polymer. The infrared spectrum was consistent with a product having the general formula:

Example 10

The procedure of Example 8 was repeated with the exception that the polymer reacted was a hydroxy-terminated polyethylene adipate ("Inolex") having a hydroxy equivalent weight of 519 to yield a viscous oil. The infrared spectrum was consistent with a product having the general formula:

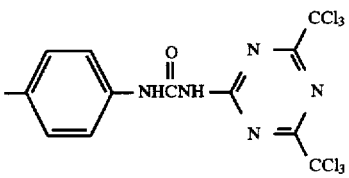

EXAMPLES 8–13

Examples 8–13 illustrate the preparation of polymers containing the halomethyl-1,3,5-triazine moiety as a terminal group by means of an isocyanate addition reaction.

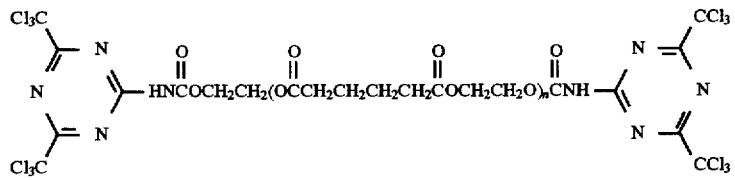

Example 11

A solution containing 400 g (0.33 equivalent) of a hydroxy terminated polybutadiene having a hydroxy equivalent weight of approximately 1200 and 58.1 g (0.66 equivalent) of tolylene 2,4-diisocyanate (hereinafter TDI) in 150 ml of dry toluene was heated from 36° C. to 59° C. in a 30 minute period and then allowed to cool for one hour to 48° C. Di-n-butyltin dilaurate (0.3 g in 3 ml of toluene) was added to the solution which was then heated to 55° C., maintained at that temperature for another 1.5 hour, and finally allowed to stand at room temperature overnight. The infrared spectrum of a product was consistent with the formation of a TDI end-capped polybutadiene. The resulting solution had a solids content of 76.8%.

To 200 g of the above solution, which contained 153.6 g (0.056 mole) of the TDI end-capped polybutadiene, was added 22.1 g (0.046 mole) of 2,4-bis(trichloromethyl)-6-[p-(2-hydroxyethoxy)styryl]-1,3,5-triazine and 0.1 g of di-n-butyltin dilaurate. The reaction mixture was stirred and heated at 65° C. for six hours. Isopropyl alcohol (2.0 g) was added to the reaction mixture, which was allowed to stand overnight to allow reaction of the remaining isocyanate groups. The solids content of the resulting solution was 47%. The infrared spectrum was consistent with a product having the general formula:

Penn Color Inc.) containing 8% phthalo blue pigment (CAS #147-14-8), 8% acrylic resin, 42% toluene, and 42% methyl ethyl ketone. The resulting solution was coated onto anodized aluminum by means of a #9 wire wound rod and dried at 65° C. for 45 seconds to produce a slightly tacky coating. A polyester film was laminated to the coating and the resulting composite exposed in a Berkey Ascor 30 in.×40 in. vacuum frame equipped with a five kw ultraviolet lamp for 40 seconds using a Stouffer 21 step √2 gray scale negative. After exposure, the polyester film was stripped away, partially removing some of the non-exposed areas. Development of a reversed image was completed by washing with methyl ethyl ketone to provide seven imaged steps.

Example 12

A solution containing 1.56 g (0.0034 equivalent) of an isocyanate terminated oligomer ("Adiprene L325", Uniroyal) having an isocyanate equivalent weight of 466, 1.25 g (0.0034 equivalent) of 2,4-bis(trichloromethyl)-6-(2-hydroxyethylamino)-1,3,5-triazine, and three drops of di-n-butyltin dilaurate in 60 ml of dry tetrahydrofuran was stirred at room temperature for 72 hours. The solvent was removed

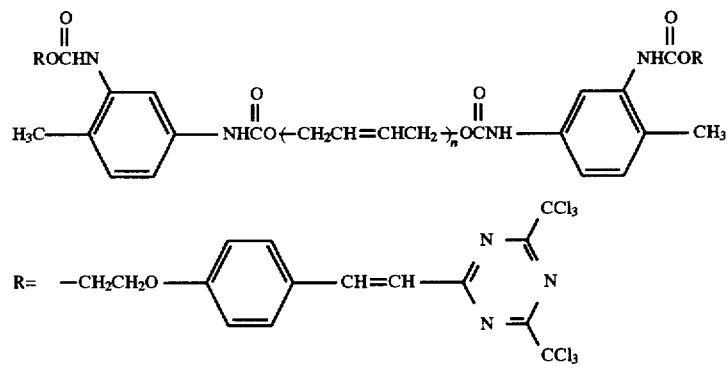

A solution was prepared using 2.0 g of the 47% solution containing the product of this example, 2.0 g of toluene, and 1.0 g of a dispersion ("Penn Color Dispersion 29S358", from the reaction mixture on a rotary evaporator to provide 2.75 g of a viscous oil. The infrared spectrum was consistent with a product having the general formula:

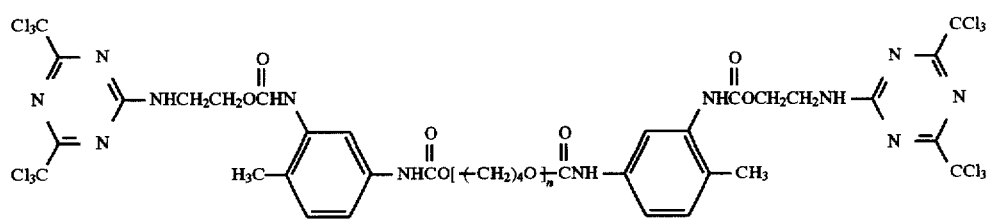

Example 13

To a solution of 5.0 g (0.0014 mole) of an aminobutyl terminated polydimethylsiloxane having a molecular weight of approximately 3770 and 15 drops di-n-butyltin dilaurate in 50 ml dry toluene (which had been freshly distilled from sodium in the presence of benzophenone) was added a solution of 1.0 g (0.003 mole) 2,4-bis(trichloromethyl)-6-isocyanato-1,3,5-triazine in 5.0 ml tetrahydrofuran. The reaction mixture was stirred at room temperature under nitrogen atmosphere for 24 hours. The solvent was removed at 40° C. on a rotary evaporator under reduced pressure. The residue was poured into an aluminum pan and dried on a high vacuum to give 4.87 g of a triazine terminated polymer. The infrared spectrum was consistent with a product having the general formula:

three drops of di-n-butyltin dilaurate, in 30 ml of dry tetrahydrofuran was stirred at room temperature for 18 hours. The solvent was removed to yield 3.41 g of a viscous oil. The infrared spectrum was consistent with a product having the general formula:

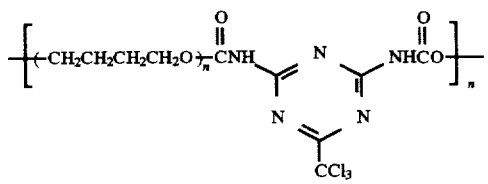

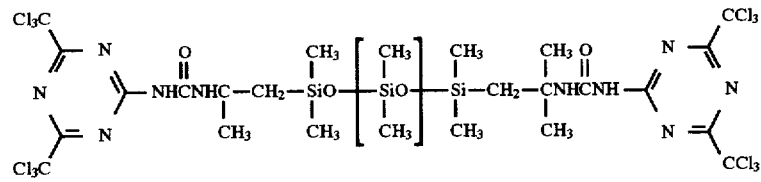

EXAMPLES 14–17

Examples 14–19 illustrate the preparation of polyurethane and silicone polymers having a halomethyl-1,3,5-triazine moiety incorporated either in a pendent position or within the polymer backbone. The polymers were prepared by isocyanate addition reactions.

Example 14

To a solution of 8.8 g (0.01 mole) of an isocyanate terminated oligomer ("Adiprene L325", Uniroyal) having an isocyanate equivalent weight of 466 and 12 drops of di-n-butyltin dilaurate in 100 ml of dry toluene was added 4.0 g (0.01 mole) of 2,4-bis(trichloromethyl)-6-[bis(2-hydroxyethyl)amino]-1,3,5-triazine. The reaction mixture was stirred at room temperature under nitrogen atmosphere for 20 hours. The solvent was removed at 40° C. on a rotary evaporator under reduced pressure. The residue was poured into an aluminum pan and dried on a high vacuum to afford 10.3 g of a viscous oil. The infrared spectrum was consistent with a product having the general formula:

Example 16

The procedure of Example 15 was repeated with the exception that 13.3 g (0.007 mole) of an amino pentyl terminated polydimethylsiloxane having a molecular weight of approximately 1850 was reacted with 2 g (0.007 mole) of 2,4-bis(isocyanato)-6-trichloromethyl-1,3,5-triazine for 15 hours. A viscous material (13.7 g) was isolated. The infrared spectrum was consistent with a product having the general formula:

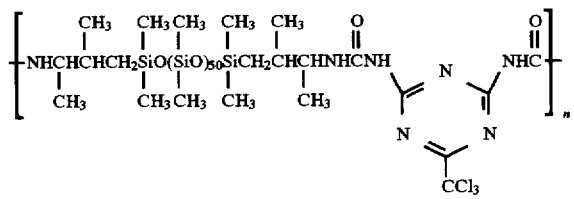

Example 17

To a solution containing 5.20 g (0.0375 mole) of tolylene 2,4-diisocyanate and three drops of di-n-butyltin dilaurate in

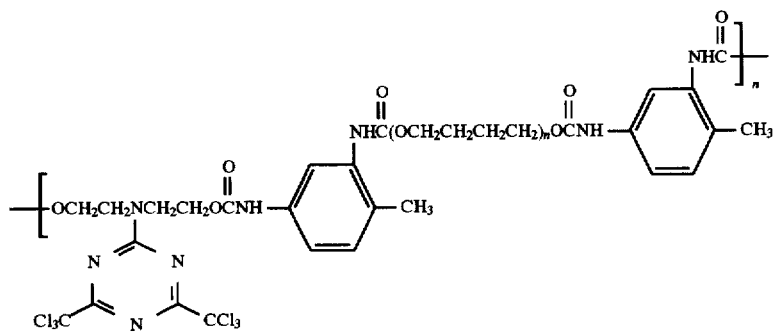

Example 15

A solution containing 2 g of polytetrahydrofuran diol (BASF) having a hydroxyl equivalent weight of 325, 1.7 g of 2,4-bis(isocyanato)-6-trichlcromethyl-1,3,5-triazine, and 40 ml of 1,2-dichloroethane was added dropwise 3.1 g (0.0075 mole) of 2,4-bis(trichloromethyl)-6-bis(2-hydroxyethyl)amino-1,3,5-triazine in 20 ml of 1,2-dichloroethane. The solution was then slowly heated to 40°

C. and allowed to stand for two hours. A solution of a polyester diol (9.56 g (0.0225 mole), "K-Flex 188-50", King Industries), having a molecular weight of approximately 425 in 20 ml of 1,2-dichloroethane was then added dropwise to the solution. The reaction continued for another five hours at 55° C. to produce a viscous solution. Infrared analysis was consistent with formation of the polyurethane. The solvent was removed at reduced pressure to yield 17 g of a fluffy white solid having the general formula:

Preparation 2

To a solution comprising 1.04 g (0.008 mole) of 2-hydroxyethyl methacrylate, 12 drops di-n-butyltin dilaurate, and 100 mg phenothiazine in 30 ml dry toluene (freshly distilled from sodium in the presence of benzophenone) was added a solution containing 2.12 g (0.006 mole) 2,4-bis(trichloromethyl)-6-isocyanato-1,3,5-

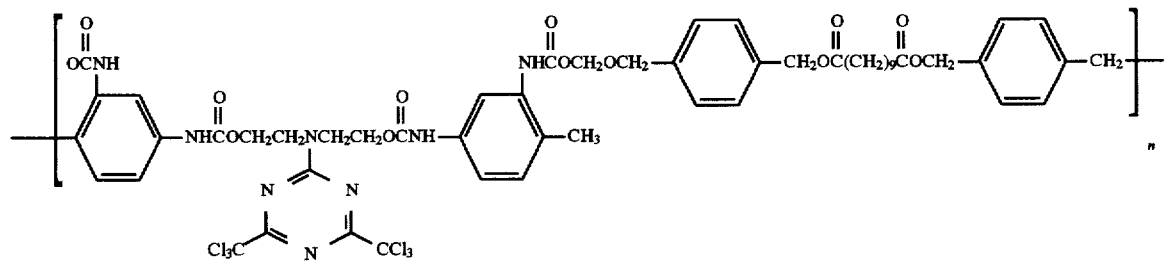

Preparations 1-3

These examples illustrate the preparation of trichloromethyl substituted 1,3,5-triazines having a polymerizable methacrylate group, which can be used to make various polymers.

Preparation 1

This example is the reaction of 2-isocyanatoethyl methacrylate with 2,4-bis(trichloromethyl)-6-[p-(2-hydroxyethoxy)styryl]-1,3,5-triazine to prepare the carbamate derivative referenced herein as MOSTOLIEM.

To a slurry of 200 g (0.42 mole) of 2,4-bis (trichloromethyl)-6-[p-(2-hydroxyethoxy)styryl]-1,3,5-triazine in 800 ml methylene chloride was added 64.8 g (0.42 mole) of 2-isocyanatoethyl methacrylate and 0.3 g of di-n-butyltin dilaurate. The mixture was stirred for six hours at room temperature, and another 6.0 g of 2-isocyanatoethyl methacrylate was added. After the mixture was stirred overnight, thin layer chromatography indicated that none of the starting triazine remained. Approximately 900 ml of ethanol was added and the solution concentrated on a rotary evaporator to provide a dense yellow slurry. The solution was filtered, after which the yellow precipitate was collected, washed with hexane, and air dried to provide 236 g of MOSTOLIEM (mp 131°-133° C.). The structural formula of the product is as follows:

triazine in toluene. The reaction mixture was stirred at room temperature under nitrogen atmosphere for 24 hours. The solvent was removed at room temperature by means of a rotary evaporator under reduced pressure. The clear residue was dissolved in a small amount of dichloromethane and loaded upon a silica gel column (100 g packed in a 50% dichloromethane/50% hexane solvent mixture) and eluted with dichloromethane. The major product was collected, the appropriate fractions were pooled, and the solvent was removed at room temperature by means of a rotary evaporator to yield the product. The product had a melting point of 66°-69° C. and λmax of 235 nm (in methanol). The structural formula of the product is as follows:

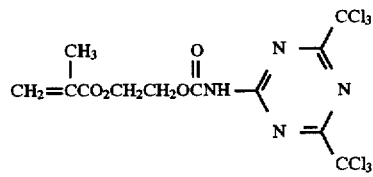

Preparation 3

The procedure of Example 19 was repeated with the exception that 2-isocyanato-4-(p-methoxyphenyl)-6-trichloromethyl-1,3,5-triazine was used. The product had a melting point of 131°-133° C. and a λmax of 308 nm (in methylene chloride). The structural formula of the product is as follows:

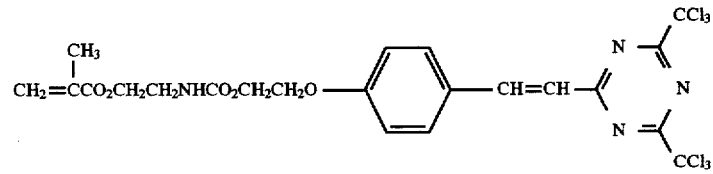 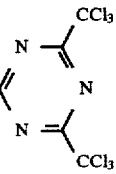

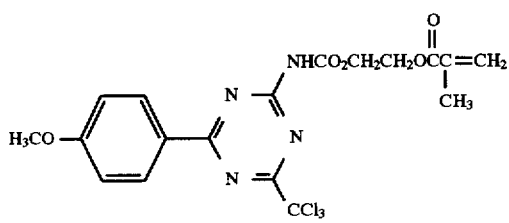

EXAMPLES 18–22

These examples illustrate the preparation of copolymer using methacrylate derivatives of the trichloromethyl-1,3,5-triazine monomers prepared in Preparations 1-3.

Example 18

One part by weight of the triazine monomer of Preparation 2, nine parts by weight of the comonomer isooctyl acrylate, and 0.005 part by weight of azobisisobutyronitrile were dissolved in 15 parts by weight of ethyl acetate in a container, and the resulting solution was purged with nitrogen for two to three minutes. The container was capped, placed in a water bath at 50° to 55° C., and agitated for approximately 20 to 24 hours. The viscosity of the solution increased and the infrared spectrum of the film forming product showed the disappearance of vinyl monomer. Samples of the polymers were analyzed in a Hewlett Packard 1090 Liquid Chromatograph equipped with a Series L diode array detector and a PLgel 10 micron "mixed" bed column using tetrahydrofuran as the solvent. The elution of the polymer with tetrahydrofuran was followed using the ultraviolet/visible light diode array detector. The spectroscopic data showed that the triazine chromophore was incorporated throughout the polymer. The polymer was isolated from the reaction solution by precipitation with hexane or by evaporation of the solvent. The structural formula of the polymeric product is as follows:

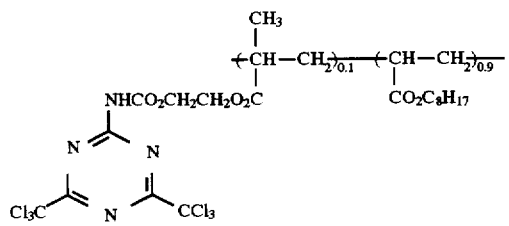

Example 19

The procedure of Example 18 was repeated with the exceptions that methyl methacrylate was used instead of isooctyl acrylate and that the triazine monomer of Preparation 3 was used instead of the triazine monomer of Preparation 2. The structural formula of the polymeric product is as follows:

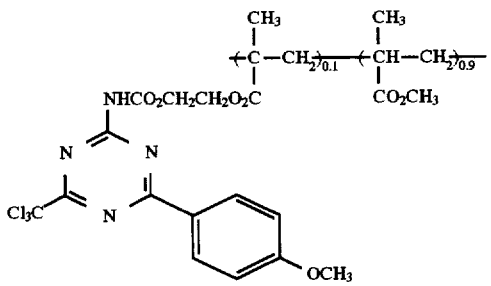

Example 20

The procedure of Example 18 was repeated with the exceptions that eight parts by weight of methyl methacrylate were used instead of nine parts by weight of isooctyl acrylate and that two parts by weight of the triazine monomer of Preparation 1 was used instead of one part by weight of the triazine monomer of Preparation 2. The structural formula of the polymeric product is as follows:

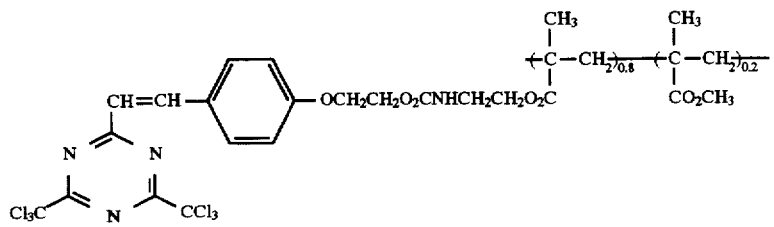

Example 21

A series of copolymers was prepared using methyl methacrylate and the triazine monomer of Preparation 1 in the weight ratios of 50/50 and 20/80, respectively, using the following procedure. The comonomers (10 g total) were dissolved in 23 g of methyl ethyl ketone containing 0.04 g of azobisisobutyronitrile. The solutions were purged with nitrogen for four minutes, the containers sealed, and the solutions agitated in a water bath at 60° C. for 24 hours. The viscosity of the solution had increased and infrared analysis was consistent with polymer formation. The general structural formula is the same as that of the polymer of Example 23, except that the ratios are 0.5/0.5 and 0.8/0.2.

Example 22

A series of polymers and copolymers were prepared according to the procedure described below. The monomeric components of these polymers and copolymers are listed in Table II. The comonomers (10 g total) were dissolved in 23 g of ethyl acetate containing 0.040 g of azobisisobutyronitrile. The solutions were purged with nitrogen for four minutes, the containers sealed, placed in a water bath, and agitated at 55° C. Reaction time was 20 hours for sample nos. 22-1 to 22-5 and six hours for sample nos. 22-6 to 22-9. The resulting polymeric solutions were diluted with another 33 g of ethyl acetate, except for sample nos. 22-6 to 22-7, to which was added a mixture containing 25 ml ethyl acetate and 8 ml methanol. The solutions had a polymer concentration of approximately 16.5% and were used to prepare the coating solutions of Example 23.

TABLE II

| Sample no. | Amount of monomer (g) | | | |
|---|---|---|---|---|
| | Methyl methacrylate | Acrylic acid | Methacrylic acid | MOSTOLIEM[1] |
| 22-1 | 8.0 | 2.0 | 0.0 | 0.0 |
| 22-2 | 7.5 | 2.0 | 0.0 | 0.5 |
| 22-3 | 9.0 | 1.0 | 0.0 | 0.0 |
| 22-4 | 8.5 | 1.0 | 0.0 | 0.5 |
| 22-5 | 8.0 | 1.0 | 0.0 | 1.0 |
| 22-6 | 8.0 | 0.0 | 2.0 | 0.0 |
| 22-7 | 7.5 | 0.0 | 1.5 | 0.5 |
| 22-8 | 10.0 | 0.0 | 0.0 | 0.0 |
| 22-9 | 9.5 | 0.0 | 0.0 | 0.5 |

[1]See Preparation 1 for method of preparing MOSTOLIEM.

EXAMPLES 23–26

Examples 23–26 illustrate the capability of polymers of this invention to undergo light induced crosslinking reactions and to become insoluble.

Example 23

This example illustrates that polymers containing the halomethyl-1,3,5-triazine moiety within the polymer structure become crosslinked and insoluble when exposed to actinic radiation. It also illustrates the light induced crosslinking of a series of acrylic copolymers of the invention compared with physical mixtures of similar copolymers and halomethyl-1,3,5-triazines.

A series of coating solutions was prepared using 6.0 g of the 16.5% polymer solutions of Example 25 by adding 0.875 g of a dispersion ("Penn Color Dispersion 29S358", Penn Color Inc.) containing 8% phthalo blue pigment (CAS #147-14-8), 8% acrylic resin, 42% toluene, and 42% methyl ethyl ketone. The halomethyl-1,3,5-triazine MOSTOLIEM of Example 18 was added to those polymers not having been copolymerized with this monomer. Each of the coating compositions was coated on grained anodized aluminum by means of a wire wound rod and dried at 65° C. for 45 seconds. Coating weights of 140–180 mg/sq. ft. were obtained. Each of the coatings was exposed for 20 seconds using a five kw Berkey Ascor 30 in.×40 in. vacuum unit (Berkey Corporation) using a Stouffer 21 step √2 gray scale negative. The coating was then placed in a tray containing ethyl acetate, wiped with a cotton pad, and the image was recorded as the number of steps remaining.

TABLE III

| Sample no. | Polymer sample no. | Added MOSTOLIEM (g) | Imaged steps |
|---|---|---|---|
| 23-1 | 22-1 | 0.05 | no image |
| 23-2 | 22-2 | none | 7 steps |
| 23-3 | 22-3 | 0.05 | no image |

TABLE III-continued

| Sample no. | Polymer sample no. | Added MOSTOLIEM (g) | Imaged steps |
|---|---|---|---|
| 23-4 | 22-3 | 0.10 | no image |
| 23-5 | 22-4 | none | 7 steps |
| 23-6 | 22-5 | none | 9 steps |
| 23-7 | 22-6 | 0.05 | no image |
| 23-8 | 22-7 | none | 5 steps |
| 23-9 | 22-8 | 0.05 | no image |
| 23-10 | 22-9 | none | 2 steps |

Analysis of the data in Table II shows excellent light induced crosslinking of the polymers having the halomethyl-1,3,5-triazine moieties incorporated within their structures. In comparison, the control samples based on simple mixtures exhibit essentially no crosslinking capability. For example, the control sample no. 23-1, which was a physical mixture of 95 parts of an 80/20 methyl methacrylate/acrylic acid copolymer with five parts of added MOSTOLIEM, did not crosslink upon exposure to provide an image. However, sample no. 23-2 which consisted of 75/20/5 methyl methacrylate/acrylic acid/MOSTOLIEM copolymer exhibited excellent crosslinking and resistance to solvent and gave seven image steps on the gray scale.

Example 24

This example illustrates the effectiveness of photoinitiated crosslinking at low concentrations of halomethyl-1,3,5-triazine in a series of acrylic copolymers.

A series of six copolymers containing decreasing amounts of a halomethyl-1,3,5-triazine moiety were prepared from methyl methacrylate/acrylic acid/MOSTOLIEM using the procedure of Example 22. The ratios of each component are shown in Table IV. The polymers were dissolved in ethyl acetate and the resulting solutions were adjusted to a concentration of 15%. Separate coating compositions were prepared from 6.0 g of the polymeric solution, and 0.80 g of a pigment dispersion containing 7.5% phthalo blue pigment and 1.5% "Elvacite AB 1015" dispersant (E. I. dupont de Nemours and Company) in methyl ethyl ketone. The solutions were coated onto grained and anodized aluminum by means of a wire wound rod and dried at 65° C. for 45 seconds to give dry coating weights of approximately 140 mg/sq. ft. These coatings were then exposed for 20 seconds in a five kw Berkey 30 in.×40 in. vacuum frame using a lithographic negative and a Stouffer 21 step √2 gray scale negative. The plates were developed using either ethyl acetate (Developer A) or an aqueous solution of 3.5% benzyl alcohol and sodium alkyl naphthalene sulfonate surfactant (Developer B). The number of developed steps is listed in Table IV. The data show that crosslinking and insolubilization result even at low halomethyl-1,3,5-triazine concentrations within the polymer.

TABLE IV

| Sample no. | Percentage of monomer (methyl methacrylate: acrylic acid:MOSTOLIEM) | Gray scale steps | |
|---|---|---|---|
| | | Developer A | Developer B |
| 24-1 | 80:15:5 | 6 steps | 6 steps |
| 24-2 | 81:15:4 | 6 steps | 6 steps |
| 24-3 | 82:15:3 | 5 steps | 5 steps |
| 24-4 | 83:15:2 | 3 steps | 4 steps |

TABLE IV-continued

| Sample no. | Percentage of monomer (methyl methacrylate: acrylic acid:MOSTOLIEM) | Gray scale steps Developer A | Developer B |
|---|---|---|---|
| 24-5 | 84:15:1 | 1 step[1] | 1 step[1] |
| 24-6 | 84.5:15:0.5 | 0 step[2] | 0 step[2] |

[1] A step scale of two was achieved at 80 seconds of exposure.
[2] At 20 seconds of exposure, a faint image was visible, however, image coating loss was evident.

Example 25

This example illustrates the effect of oxygen on the photoinitiated crosslinking of polymers containing halomethyl-1,3,5-triazine moieties.

Three terpolymers were prepared from methyl methacrylate (MMA), 2-dimethylaminoethyl methacrylate (DMAEMA), and MOSTOLIEM (the product of Preparation 1) according to the procedure of Example 22 with the exception that the reaction temperature was 60° C. and the reaction time was 17 hours. Coating solutions were prepared from these three terpolymers and coated onto anodized aluminum according to the same procedure described in Example 24. Exposure and processing was also conducted according to Example 24 except that one set was conducted in vacuum (reduced oxygen) and another set was conducted without vacuum.

TABLE V

| Sample no. | Percentage of monomer (MMA: DMAEMA:MOSTOLIEM) | Gray scale with vacuum | Gray scale without vacuum |
|---|---|---|---|
| 25-1 | 85:10:5 | 7 | 7 |
| 25-2 | 80:15:5 | 7 | 7 |
| 25-3 | 75:20:5 | 8 | 8 |

Table V shows that the degree of crosslinking is not significantly influenced by oxygen inhibition.

Example 26

This example illustrates the light induced crosslinking of coatings made of silicone-containing polymers having halomethyl-1,3,5-triazine moieties.

Separate solutions were prepared by dissolving 0.5 g of the silicone containing polymers having halomethyl-1,3,5-triazine moieties prepared in Examples 13 and 16 in two ml of hexane. These solutions were then coated onto a paper base using a #8 wire wound rod and dried with a hot air gun to provide a soft oily film. Each coating was then cured with actinic radiation by passing them through a Linde Photocure System Unit (purchased from Union Carbide Corporation) at a speed of 75 fpm with a nitrogen flow of 125 cu. ft./in./ft. width. The coatings cured to dry silicone elastomer films which exhibited excellent adhesive release when contacted with a high tack pressure sensitive adhesive tape.

EXAMPLES 27-29

Examples 27-29 illustrate the preparation of copolymers containing a halomethyl-1,3,5-triazine moiety and an unsaturated vinyl moiety suitable for free radical chain polymerization.

Example 27

A solution of 8.5 g of methyl methacrylate, 1.0 g of 2-hydroxyethyl methacrylate, 0.5 g of the MOSTOLIEM monomer from Preparation 1, and 0.10 g of azobisisobutyronitrile in 40 ml of ethyl acetate in a narrow mouth bottle was purged for three minutes with nitrogen, and the bottle was then sealed. The sealed bottle was placed in a water bath at 60° C. and agitated for 17 hours to provide a viscous solution. After the solution was cooled to room temperature, 1.05 g of 2-isocyanatoethyl methacrylate was added, and following this addition, one drop of di-n-butyltin dilaurate was added, and the reaction mixture was stirred for 18 hours. Infrared analysis of the product was consistent with incorporation of the methacrylate moiety onto the polymer and gel permeation chromatography analysis showed that the 2,4-bis(trichloromethyl)-6-styryl-1,3,5-triazine moiety had also been incorporated into the polymer. The formula of the copolymeric product is as follows:

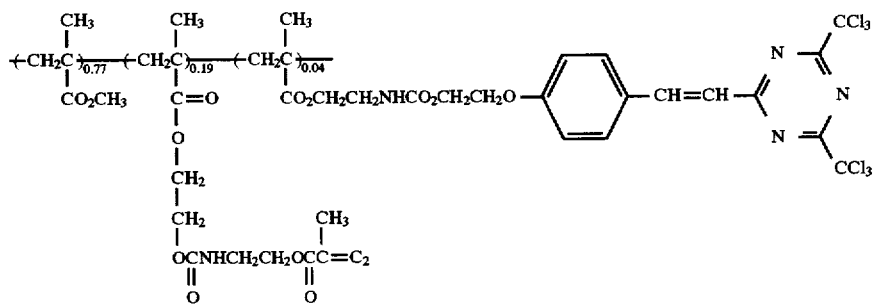

A coating of this copolymer product was exposed on a Linde Photocure System Unit (Union Carbide Corporation) under a nitrogen atmosphere to provide an insoluble film.

Example 28

A copolymer was prepared according to the procedure of Example 27 using 1.0 g of 2-vinyl-4,4-dimethyl-2-oxazolin-5-one and 9.0 g of methyl methacrylate. To the resulting viscous solution was added 1.73 g of 2,4-bis(trichloromethyl)-6-[p-(2-hydroxyethoxy)styryl]-1,3,5-triazine, 0.469 g of 2-hydroxyethyl methacrylate, and 0.045 g of ethane sulfonic acid. The resulting solution was heated at 55° C. for another 18 hours. Infrared analysis of the product showed the disappearance of the azlactone group and was consistent with the desired product. Gel permeation chromatography using a diode array detector confirmed that the styryl-bis(trichloromethyl)-1,3,5-triazine moiety had been incorporated into the polymer. The general formula of the polymeric product is as follows:

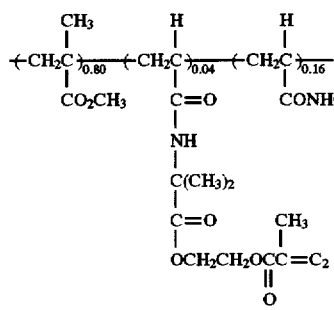

A coating of this copolymer was exposed in a Linde Photocure System Unit at 75 fpm under nitrogen to produce a crosslinked, insoluble film.

Example 29

A copolymer was prepared according to the procedure of Example 27 by reacting 1.5 g of 2-hydroxyethyl acrylate and 8.5 g of methyl methacrylate. To the resulting solution was added 1.19 g of 2-isocyanatoethyl methacrylate, 1.40 g of 2-isocyanato-4,6-bis(trichloromethyl)-1,3,5-triazine, and one drop of di-n-butyltin dilaurate, and the reaction was allowed to proceed for 18 hours at room temperature. The infrared spectrum of the product was consistent with formation of the pendent methacrylate and trichloromethyl-1,3,5-triazine adducts, and gel permeation chromatography confirmed that the triazine had been incorporated into the polymer. The general formula of the polymeric product is as follows:

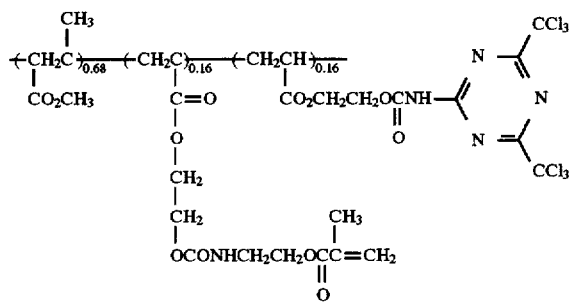

A coating of this copolymer was exposed in Linde Photocure System Unit at 75 fpm under nitrogen to produce a crosslinked, insoluble film.

EXAMPLES 30–31

Examples 30 and 31 illustrate the use of polymers having halomethyl-1,3,5-triazine moieties as photoinitiators for the free radical polymerization of compositions containing vinyl monomer.

Example 30

Solutions of photopolymerizable compositions were prepared by combining the following ingredients in the amounts indicated in Table VI:

TABLE VI

| Ingredient | 30-1 (Control) | 30-2 | 30-3 | 30-4 | 30-5 | 30-6 | 30-7 | 30-8 |
|---|---|---|---|---|---|---|---|---|
| 86.8% MMA:13.2% MAA | 1.54 | — | — | — | 0.52 | — | 1.53 | 1.53 |
| 100% MOSTOL | 0.055 | — | — | — | — | — | — | — |
| 82.1% MMA:13.2% MAA:4.7% MOSTOLIEM | — | 1.62 | — | — | — | — | — | — |
| 85% MMA:10.8% AA:4.7% MOSTOLIEM | — | — | 1.62 | — | — | — | — | — |
| 75% MMA:20% AA:5% MOSTOLIEM | — | — | — | 1.50 | — | — | — | — |
| 70% MMA:20% AA:10% MOSTOLIEM | — | — | — | — | 1.08 | — | — | — |
| 80% MMA:15% DMAEMA:5% MOSTOLIEM | — | — | — | — | — | 1.62 | — | — |
| 20% MMA:80% MOSTOLIEM | — | — | — | — | — | — | 0.09 | — |
| 20% MAA:80% MOSTOLIEM | — | — | — | — | — | — | — | 0.09 |
| PETA | 0.95 | 0.95 | 0.95 | 0.95 | 0.95 | 0.95 | 0.95 | 0.95 |

TABLE VI-continued

| Ingredient | Amount (g) | | | | | | | |
|---|---|---|---|---|---|---|---|---|
| | 30-1 (Control) | 30-2 | 30-3 | 30-4 | 30-5 | 30-6 | 30-7 | 30-8 |
| Dispersion | 2.50 | 2.50 | 2.50 | 2.50 | 2.50 | 2.50 | 2.50 | 2.50 |
| MEK | 7.00 | 7.00 | 7.00 | 7.00 | 7.00 | 7.00 | 7.00 | 7.00 |

MMA = Methyl methacrylate
MAA = Methacrylic acid
AA = Acrylic acid
MOSTOL = 2,4-bis(trichloromethyl)-6-[p-(2-hydroxyethoxy)styryl-1,3,5-triazine
MOSTOLIEM = product of Preparation 1
DMAEMA = 2-Dimethylaminoethyl methacrylate
PETA = Pentaerythritol tetraacrylate (SR-295, Sartomer Resins)
Dispersion = Dispersion containing 8% phthalo blue pigment (CAS #147-14-8), 8% acrylic resin, 42% toluene, 42% methyl ethyl ketone, Penn Color, Inc.
MEK = Methyl ethyl ketone The MOSTOLIEM monomer of Preparation 1 was prepared by means of the procedure of Example 24. The amount of polymeric initiator in each of the samples was adjusted as necessary to provide an amount of trichloromethyl-1,3,5-triazine moiety (MOSTOL) equivalent to that used in the control sample no. 30-1. The photopolymerizable compositions were coated onto anodized aluminum plates by means of a #12 wire wound rod, and dried at 65° C. for 45 seconds to provide a light sensitive coating having a coating weight of 130–145 mg/sq. ft. These plates were exposed to a five kw lamp using a Berkey 30 in.×40 in. vacuum frame to a Stouffer 21 step √2 gray scale negative, developed by immersion in methyl ethyl ketone, and wiped with a cotton pad. The number of steps, which reflects the extent of polymerization, were recorded. The data in Table VII show that polymer bound MOSTOLIEM initiators exhibit excellent sensitivity, and, in some cases, are more sensitive than the control Sample 30-1.

TABLE VII

| Sample no. | Imaged steps on gray scale |
|---|---|
| 30-1 (Control) | 7 |
| 30-2 | 7 |
| 30-3 | 10 |
| 30-4 | 12 |
| 30-5 | 11 |
| 30-6 | 10 |
| 30-7 | 4 |
| 30-8 | 2 |

Example 31

This example illustrates the preparation of photosensitive elements containing the halomethyl-1,3,5-triazine compounds of this invention and the spectral response of the compounds in such elements.

A solution containing 74.24 g azeotrope of 1-propanol and water (71.8% 1-propanol/28.2% water), 4.32 g pentaerythritol tetraacrylate (SR-295, Sartomer Resins), 5.64 g oligomer (prepared according to U.S. Pat. No. 4,228,232 and 60.9% in methyl ethyl ketone), 0.30 g triethylamine, and 14.88 g Formvar 12/85T/Radiant Red pigment (9.4% in azeotrope) was prepared. To 2.5 g of this solution was added 2.5 mg dimethylaminobenzylacetone (DMBA) and 10 mg initiator, and the resulting mixture was shaken in the dark for 15 minutes. The solution was filtered through glass wool and coated onto a grained, anodized aluminum plate by means of a #12 Mayer bar. The plate was dried at 66° C. for two minutes and cooled to room temperature. Over this coating was applied a topcoat formulation prepared from 5.00 g carboxymethyl cellulose (CMC-7L), 0.26 g aqueous polyethylene glycol alkyl aryl ether ("Triton X-100", 10% water), and 95.00 g water with a #14 Mayer bar. The topcoat was carefully dried with a heat gun. The plates were exposed for five seconds in air on top of a draw-down glass in a 3M Seventy exposure unit equipped with a two kw photopolymer bulb through a Stouffer 21 step √2 gray scale negative. The plates were soaked in a developer solution prepared from 784.4 g deionized water, 16.7 g sodium metasilicate pentahydrate, 33.4 g 1-propanol, and 0.5 g sodium salt of dodecyldiphenylether disulfonic acid ("Dowfax-2A1" (45% solution in water)) for 15 seconds and rubbed 10 times with a 4 in.×4 in. cotton pad. The relative sensitivities for the triazines of Examples 1–5 are shown in Table VIII.

TABLE VIII

| Sample no. | Initiator (based on Example no.) | Solid step |
|---|---|---|
| 31-1 | 1 | 11 |
| 31-2 | 2 | 14 |
| 31-3 | 3 | 10 |
| 31-4 | 4 | 9 |
| 31-5 | 5 | 8 |

While the invention has been described in detail and with reference to specific embodiments thereof, it will be apparent to one skilled in the art that various changes and modifications can be made therein without departing from the spirit and scope thereof.

What is claim:

1. A photocrosslinkable, photoinsolubilizing coating composition comprising (a) a solvent and (b) a polymer having a polymeric backbone having covalently bonded thereon at least one 1,3,5-triazine nucleus represent by the formula:

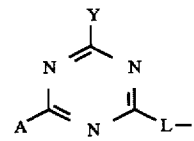

wherein

A represent a member selected from the group consisting of mono-, di, and trichloromethyl groups, mono-, di-, and tribromomethyl groups, and mono-, di-, and triiodomethyl groups, Y represents a member selected from the group consisting of alkoxy substituted aryl groups, vinyl substituted aryl groups, and alkynyl substituted aryl groups, and L represents a group or covalent bond linking the triazine nucleus to the polymer, the portion of L directly attached to to the triazine nucleus being selected from the group consisting of (a) carbon atom of an aryl group, (b) carbon atom of a —CH=CH— group, (c) carbon atom of an ester group, (d) amino group selected from the group consisting of (1) aminoaryl groups wherein the nitrogen atom of the amino group is attached to the triazine nucleus and (2) amino groups wherein the nitrogen atom of the amino group is attached to both the triazine nucleus and the carbon atom of at least one —CH$_2$CH$_2$— group,and (e) oxygen atom, wherein said polymer is dissolved or dispersed in said solvent and is rendered insoluble in said solvent when coated and dried upon a support and irradiated with actinic radiation.

2. The coating composition of claim 1, wherein said at least one triazine nucleus is attached to said polymeric backbone as a terminal group.

3. The coating composition of claim 1, wherein said at least one triazine nucleus is attached to said polymeric backbone as a pendant group.

4. The coating composition of claim 1, wherein said polymer has a molecular weight greater than about one thousand.

5. The coating composition of claim 1, wherein said polymer has a molecular weight ranging from about 5,000 to about one million.

6. The coating composition of claim 1, wherein the weight percentage of 1,3,5-triazine nuclei present in the polymer ranges from about 0.01 mole percent to about 90 mole percent.

7. The coating composition of claim 1, wherein the weight percentage of 1,3,5-triazine nuclei present in the polymer ranges from about 0.10 mole percent to about 70 mole percent.

8. The coating composition of claim 1, wherein A represents a trichloromethyl or tribromomethyl group.

9. The coating composition of claim 1, wherein the backbone of the polymer is selected from the group consisting of polyamides, polyesters, polyurethanes, polysiloxanes, phenolic resin, poly(aryl methylenes), polystyrenes, poly(acrylic esters), poly(acrylic acids), polyacrylamides, polyacrylonitrile, polyethylenes, polybutadienes, polyvinyl esters, polyvinyl alcohol, polyvinyl acetals, polyvinyl ethers, polyvinyl pyrrolidone, polyvinyl pyridine, polyvinyl chloride, polyethylene oxides, polypropylene oxides, polyethylene glycols, polypropylene glycols, polyethyleneimines, epoxide resins, phenoxy resins, polytetrahydrofuran, polycaprolactone, poly(styrene sulfonic acid), gelatins, alkylcelluloses, hydroxyalkylcelluloses, carboxymethylcelluloses, starches, and polysaccharides.

10. The coating composition of claim 1, wherein solubilizing or dispersing substituents are attached to the backbone of said polymer; said solubilizing or dispersing substituents are selected from the group consisting of alkyl and aryl carboxylic acids; sulfonic acids; phosphonic acids; phenols, and salts thereof; and alkyl and aryl amine, and quaternary salts thereof.

11. The coating composition of claim 1, wherein solubilizing or dispersing segments are covalently attached to the backbone of said polymer, said solubilizing or dispersing segments being derived from water soluble monomers.

12. The coating composition of claim 11, wherein said polymer is soluble or dispersible in water.

13. The coating composition of claim 12, wherein said solubilizing or dispersing segments are derived from monomers selected from the group consisting of ethylene oxide, vinyl pyrrolidone, vinyl alcohol, acrylamide, vinyl ethers, and ethylene imine.

14. The coating composition of claim 11 wherein said water soluble monomers are selected from the group consisting of ethylene oxide, vinyl pyrrolidone, vinyl alcohol, acrylamide, vinyl ethers and ethylene imine.

15. The coating composition of claim 1, wherein said at least one triazine nucleus is incorporated within the backbone of the polymer.

16. The coating composition of claim 1 where said composition further comprises an unsaturated, polymerizable compound capable of undergoing free-radical initiated, chain-propagating, addition polymerization.

17. A photocrosslinkable photoinsolubilizable coating composition comprising a polymer capable of being dissolved or dispersed in a solvent and capable of being rendered insoluble in said solvent when coated upon a support and irradiated with actinic radiation, said polymer having covalently bonded thereon at least one pendant unsaturated group capable of undergoing free-radical polymerization and at least one 1,3,5-triazine nucleus represented by the formula:

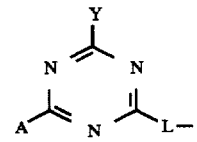

wherein

A represents a member selected from the group consisting of mono-, di-, and trichloromethyl groups, mono-,di-, and tribromomethyl groups, and mono-, di-, and triiodomethyl groups, Y represents a member selected from the group consisting of —A, —L—, —NH$_2$, —NHR, —NR$_2$, —OR, and —R', where each R independently represents a member selected from the group consisting of alkyl groups, and aryl groups, and R' represents a member selected from the group consisting of alkyl groups, aryl groups, alkenyl groups, polyalkenyl groups, and heteroaromatic groups, and L represents a group or covalent bond linking the triazine nucleus to the polymer, the portion of L directly attached to the triazine nucleus being selected from the group consisting of (a) carbon atom of an aryl group, (b) carbon atom of a —CH=CH— group, (c) carbon atom of an ester group, (d) amino group selected from the group consisting of (1) aminoaryl groups wherein the nitrogen atom of the amino group is attached to the triazine nucleus and (2) amino groups wherein the nitrogen atom of the amino group is attached to both the triazine nucleus and the carbon atom of at least one —CH$_2$CH$_2$— group, and (e) oxygen atom.

18. The coating composition of claim 17, wherein said at least one pendant unsaturated group is selected from the group consisting of acrylate groups, methacrylate groups, and acrylamide groups.

19. The coating composition of claim 17 further comprising an unsaturated, polymerizable compound capable of undergoing free-radical initiated, chain-propagating, addition polymerization.

20. A photocrosslinkable, photoinsolubilizable coating composition comprising a polymer capable of being dissolved or dispersed in a solvent and capable of being rendered insoluble in said solvent when coated upon a support and irradiated with radiation, said polymer having covalently bonded thereon at least one pendant vinyl ether group that reacts by acid-induced polymerization and at least one 1,3,5-triazine nucleus represented by the formula:

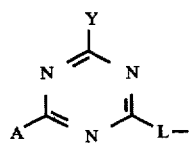

wherein

A represents a member selected from the group consisting of mono-, di-, and trichloromethyl groups, mono-,di-, and tribromomethyl groups, and mono-, di-, and triiodomethyl groups, Y represents a member selected from the group consisting of —A, —L—, —NH$_2$, —NHR, —NR$_2$, —OR, and —R', where each R independently represents a member selected from the group consisting of alkyl groups, and aryl groups, and R' represents a member selected from the group consisting of alkyl groups, aryl groups, alkenyl groups, polyalkenyl groups, and heteroaromatic groups, and L represents a group or covalent bond linking said triazine nucleus to said polymer, the portion of L directly attached to said triazine nucleus being selected from the group consisting of (a) carbon atom of an aryl group, (b) carbon atom of a —CH=CH— group, (c) carbon atom of an ester group, (d) amino group selected from the group consisting of (1) aminoaryl groups wherein the nitrogen atom of said amino group is attached to said triazine nucleus and (2) amino groups wherein the nitrogen atom of said amino group is attached to both said triazine nucleus and said carbon atom of at least one —CH$_2$CH$_2$— group, and (e) oxygen atom.

21. A photocrosslinkable, photoinsolubilizable coating composition comprising:

(i) a polymer capable of being dissolved or dispersed in a solvent and capable of being rendered insoluble in said solvent when coated upon a support and irradiated with radiation, said polymer having covalently bonded thereon at least one 1,3,5-triazine nucleus represented by the formula

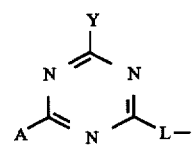

wherein

A represents a member selected from the group consisting of mono-, di-, and trichloromethyl groups, mono-,di-, and tribromomethyl groups, and mono-, di-, and triiodomethyl groups;

Y represents a member selected from the group consisting of —A, —L—, —NH$_2$, —NHR, —NR$_2$, —OR, and —R', where each R independently represents a member selected from the group consisting of alkyl groups having 1-12 carbon atoms, aryl groups having no more than 5 fused rings, aryl groups substituted with alkyl having 1-12 carbon atoms, halogen, aryl, alkyloxy, aryloxy, alkylthio, amino, carboxylic acid, carboxylate, acyl, acylamino, nitro, or sulfonic substituents, and R' represents a member selected from the group consisting of alkyl groups having 1-12 carbons atoms, aryl groups having no more than 5 fused rings, aryl groups substituted with alkyl having 1-12 carbon atoms, halogen, aryl, alkyloxy, aryloxy, alkylthio, amino, carboxylic acid, carboxylate, acyl, acylamino, nitro, or sulfonic acid substituents, alkenyl or polyalkenyl groups having 1-6 conjugated double bonds substituted with an aryl or heteroaromatic substituent, alkynyl groups having 1-3 conjugated triple bonds substituted with an aryl or heteroaromatic substituent, and heteroaromatic groups having 1-3 fused rings, wherein heteroatoms within said heteroaromatic group are selected from the group consisting of nitrogen, oxygen, sulfur, and combinations thereof;

L represents a group or covalent bond linking said triazine nucleus to said polymer, the portion of L directly attached to said triazine nucleus being selected from the group consisting of (a) carbon atom of an aryl group, (b) carbon atom of a —CH=CH— group, (c) carbon atom of an ester group, (d) amino group selected from the group consisting of (1) aminoaryl groups wherein the nitrogen atom of said amino group is attached to said triazine nucleus and (2) amino groups wherein the nitrogen atom of said amino group is attached to both said triazine nucleus and said carbon atom of at least one —CH$_2$CH$_2$— group, and (e) oxygen atom; and (ii) at least one unsaturated polymerizable compound capable of undergoing free-radical polymerization.

* * * * *